United States Patent [19]

Kuroki

[11] Patent Number: 5,508,715
[45] Date of Patent: Apr. 16, 1996

[54] DATA SELECTION CIRCUIT

[75] Inventor: Hisashi Kuroki, Saitama, Japan

[73] Assignee: Kabushiki Kaisha Toshiba, Kawasaki, Japan

[21] Appl. No.: 305,372

[22] Filed: Sep. 13, 1994

[30]     Foreign Application Priority Data

Sep. 13, 1993  [JP]  Japan .................................. 5-227057

[51] Int. Cl.$^6$ .................................................. G09G 3/18
[52] U.S. Cl. .................. 345/51; 345/50; 345/52
[58] Field of Search .................. 345/50–52, 92, 345/95, 98, 99, 103

[56]              References Cited

U.S. PATENT DOCUMENTS

| 4,060,802 | 11/1977 | Matsuki ..................................... 345/51 |
| 4,781,437 | 11/1988 | Shields et al. ......................... 345/51 X |
| 4,822,142 | 4/1989 | Yasui .................................. 345/103 X |
| 4,855,724 | 8/1989 | Yang . | |
| 4,931,787 | 6/1990 | Shannon . | |
| 5,151,689 | 9/1992 | Kabuto et al. .......................... 345/103 |

FOREIGN PATENT DOCUMENTS

| 0234734 | 9/1987 | European Pat. Off. . |
| 0514845 | 11/1992 | European Pat. Off. . |
| 0544427 | 6/1993 | European Pat. Off. . |

OTHER PUBLICATIONS

High Speed CMOS 74HC/HCT/HCU Logic Family. Data Handbook Integrated Circuits, Book IC06, "Philips Semiconductors", 1991, pp. 531–535.

IBM Technical Disclosure Bulletin, vol. 27, No. 1B, Jun. 1984, W. R. Griffin, et al., "CMOS Select 1 Of N Multiplexer", pp. 651–652.

*Primary Examiner*—Ulysses Weldon
*Attorney, Agent, or Firm*—Oblon, Spivak, McClelland, Maier & Neustadt

[57]              ABSTRACT

The data selection circuit of 1/n Duty-1/m Bias activating scheme of the present invention includes (m+1) selectors which are independently provided. Each selector includes $2^n$ decoder sections for subjecting n-bit select data supplied from the exterior to different decoding processes, and $2^n$ inverter sections respectively connected in series with the decoder sections, outputs of the inverter sections being connected in a wired OR connection configuration. The $2^n \times (m+1)$ inverter sections are supplied with different preset input signals determined by integers m, n ($m \geq 2$, $n \geq 2$) and the logic of the corresponding decoding sections from the exterior. Thus, the data selection circuit of 1/n Duty-1/m Bias scheme in which the number of necessary transistors is significantly reduced can be provided.

13 Claims, 10 Drawing Sheets

| | | 0 | 1 | 0 | 1 | 0 | 1 | 0 | 1 |
|---|---|---|---|---|---|---|---|---|---|
| S1 | | 0 | 1 | 0 | 1 | 0 | 1 | 0 | 1 |
| S2 | | 0 | 0 | 1 | 1 | 0 | 0 | 1 | 1 |
| S3 | | 0 | 0 | 0 | 0 | 1 | 1 | 1 | 1 |
| SEL # | | 0 | 1 | 2 | 3 | 4 | 5 | 6 | 7 |
| SELECT DATA | S3 | ▨ | ▨ | ▨ | ▨ | | | | |
| | $\overline{S3}$ | | | | | ▨ | ▨ | ▨ | ▨ |
| | S2 | ▨ | ▨ | | | ▨ | ▨ | | |
| | $\overline{S2}$ | | | ▨ | ▨ | | | ▨ | ▨ |
| | S1 | ▨ | | ▨ | | ▨ | | ▨ | |
| | $\overline{S1}$ | | ▨ | | ▨ | | ▨ | | ▨ |
| | $\overline{S1}$ | ▨ | | ▨ | | ▨ | | ▨ | |
| | S1 | | ▨ | | ▨ | | ▨ | | ▨ |
| | $\overline{S2}$ | ▨ | ▨ | | | ▨ | ▨ | | |
| | S2 | | | ▨ | ▨ | | | ▨ | ▨ |
| | $\overline{S3}$ | ▨ | ▨ | ▨ | ▨ | | | | |
| | S3 | | | | | ▨ | ▨ | ▨ | ▨ |

DECODER (PMOS) / DECODER (NMOS)

DATA SELECTION CIRCUIT

BACKGROUND OF THE INVENTION

1. Field of the Invention

The present invention relates to a data selection circuit and, more particularly, to a driving circuit for a liquid crystal display (hereinafter referred to as LCD) of 1/n Duty-1/m Bias activating scheme.

2. Description of the Related Art

In the LCD, data, information etc. are displayed based on the combinations of activation and deactivation of the segments which are arranged separately on the LCD panel. As an LCD activating method, a 1/n Duty-1/m Bias activating scheme is well known. In this scheme, a segment signal (hereinafter referred to as a SEG signal) commonly supplied to n segments is used for driving n segments among all of the segments of the LCD, and the activation of each segment is controlled by switching the segment signal to m power source voltage levels, at preset timings based on $2^n$ combinations of ON/OFF states which are supplied to the n segments. For instance, ½ Duty-½ Bias scheme, ⅓ Duty-⅓ Bias scheme, ¼ Duty-¼ Bias scheme, etc. are used.

Figure 1:
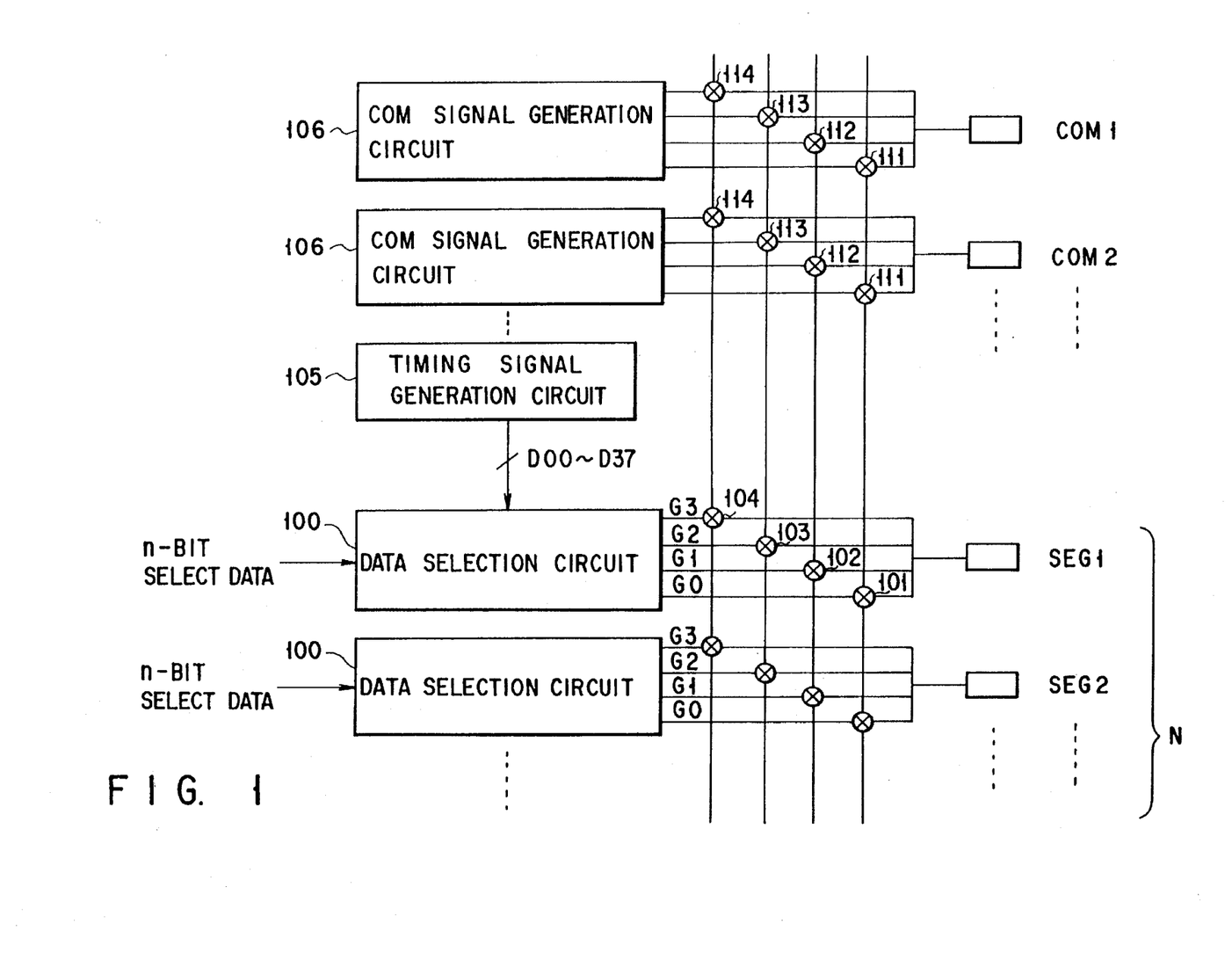
FIG. 1 is a block diagram showing a general structure of an LCD driving circuit to which ⅓ Duty-⅓ Bias scheme is applied.

FIG. 1 is a block diagram showing a general structure of an LCD driving circuit using a ⅓ Duty-⅓ Bias activating scheme. A timing signal generation circuit 105 generates timing signals D00 to D37. A data selection circuit 100 generates output signals G0 to G3 according to input n-bit select data, for example, 3-bit select data and a timing signal to turn ON/OFF analog switches 101 to 104. Each of the analog switches 101 to 104 is connected correspondingly to one of three types (m=3) of power sources, in which a power source voltage of V0 is used as a reference level. A COM signal creation circuit 106 generates COM signals which are inherent to respective segments as will be described later. For example, N data selection circuits 100 and N COM signal creation circuits 106 are provided according to the LCD panel.

Figure 2:
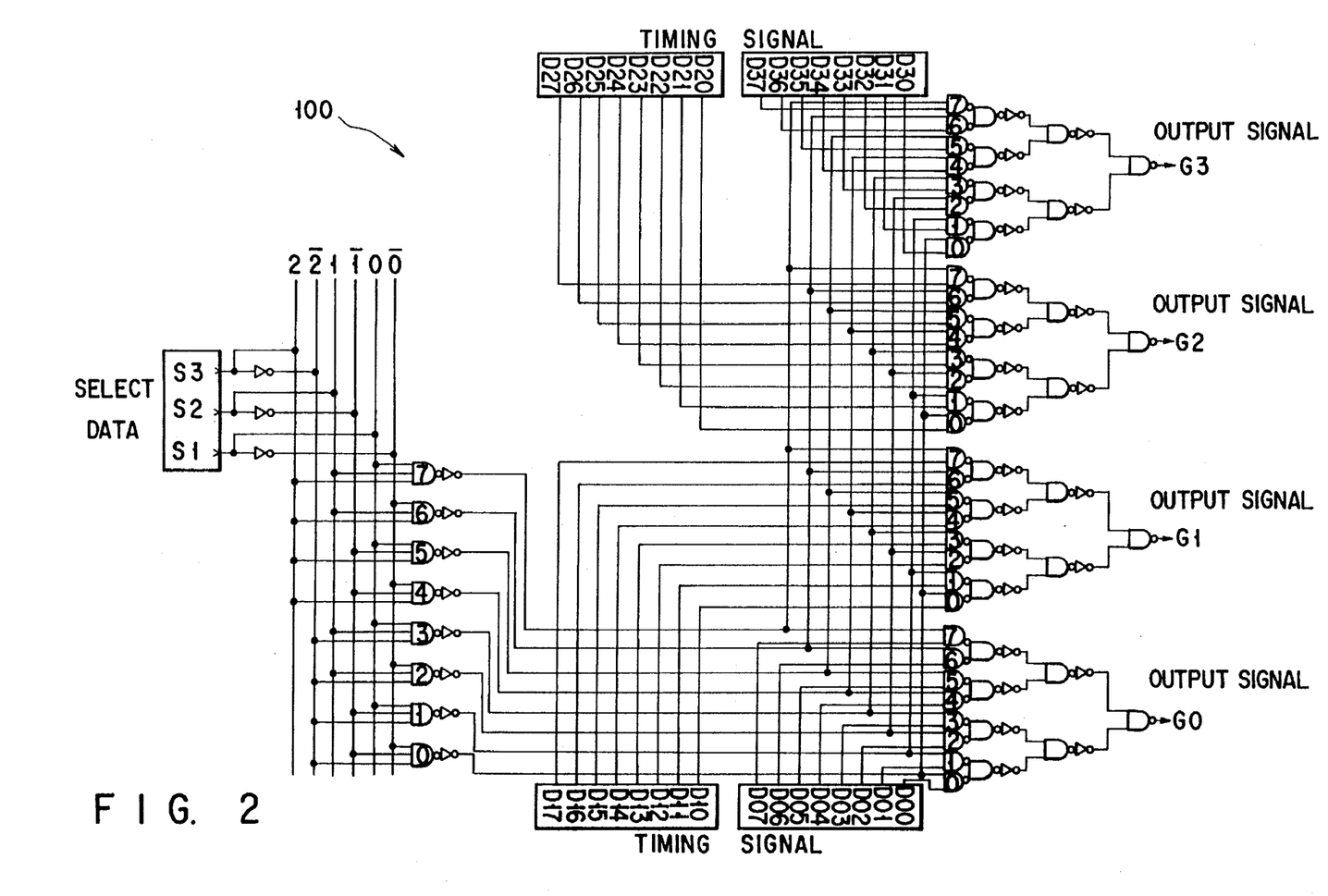
FIG. 2 is a circuit diagram showing a structure of the conventional data selection circuit.
Figures 3, 5:
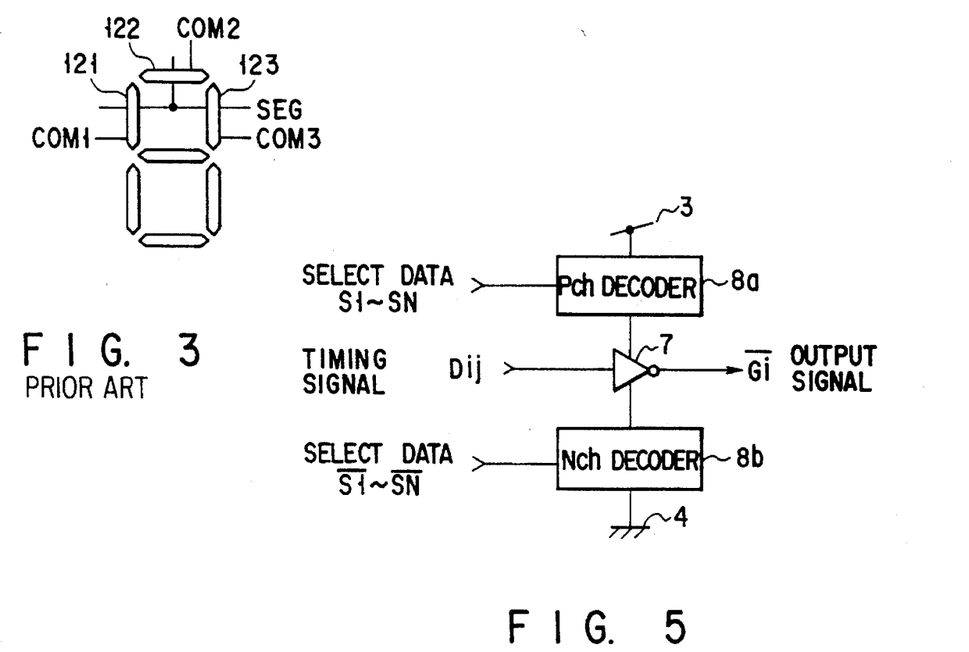
FIG. 3 is a diagram showing seven-segment display elements of an LCD.
FIG. 5 is a diagram showing the basic circuit of a data selection circuit of the present invention.

FIG. 2 is a circuit diagram showing a construction of the conventional data selection circuit 100. Now, the conventional LCD driving circuit, particularly, a data selection circuit is explained. As shown in FIG. 2, the data selection circuit 100 includes a large number of NAND circuits and NOT circuits. A case wherein the LCD driving circuit drives three segments 121 to 123 in the seven-segment display device shown in FIG. 3 will be explained. The data selection circuit 100 of the LCD driving circuit is supplied with n-bit select data, for example, 3-bit select data S1, S2, S3 which indicate eight combinations ($2^3$) of ON/OFF states of the three segments 121 to 123 (n=3) whose activation states are controlled by one SEG signal. Values of the respective bits S1 to S3 of the select data vary according to the ON or OFF states of the segments 121 to 123. Each value of the bits is set to "1" when the segment is set in the ON state, and set to "0" when the segment is set in the OFF state. The data selection circuit 100 is supplied with timing signals D00 to D07, D10 to D17, D20 to D27 and D30 to D37, as described later, from a timing signal generation circuit 105. The data selection circuit 100 outputs one of the timing signals D00 to D07 as a signal G0 according to the content of the 3-bit select data S1, S2, S3 supplied thereto. Likewise, the data selection circuit 100 selects signals from the respective groups of signals D10 to D17, D20 to D27, and D30 to D37 according to the select data, and outputs the selected signals as signals G1, G2 and GE. The output signals G1, G2 and GE are supplied to analog switches 101 to 104 shown in FIG. 1 as control signals to control the ON/OFF states of the analog switches. One ends of the current paths of the respective analog switches 101 to 104 are connected to power sources V0 to V3 having different supply voltage levels. A potential of one of the power sources V0 to V3 appears at the output terminal at preset timing by the ON/OFF control. As a result, the SEG signal is output according to select data, that is, the combination of values of the bit data items S1 to S3. The SEG signal is commonly supplied to the respective electrodes of the segments 121 to 123 of FIG. 3. On the other hand, the other electrodes of the segments 121 to 123 are respectively supplied with COM1 signal, COM2 signal and COM3 signal generated by the COM signal generation circuit 106 in FIG. 1. Therefore, as shown in FIG. 3, potential differences between the SEG signal and the respective COM signals, that is, SEG-COM1, SEG-COM2 and SEG-COM3 are supplied between the respective two electrodes of the segments 121 to 123 according to the select data. Depending upon the value of the potential differences between the SEG signal and the COM signals, selected one of the segments 121 to 123 are activated or deactivated so as to be set into the ON/OFF state according to select data.

However, the conventional data selection circuit has the following drawback. That is, in recent, multibit circuit configuration come to be frequently used in various circuits. If the conventional data selection circuit is formed in a multibit circuit configuration in order to cope with the above situation, the number of transistors constituting the data selection circuit is significantly increased with an increase in the number of select bits. For example, when n=m (n≧2), as many as $(n+1)(2^{n+3}+2^{n+2}-8)$ elements are required. When the number of select bits is increased, an area occupied by the data selection circuit in an LC or LSI circuit must be made extremely large. This cause a serious drawback in the design/manufacturing process.

SUMMARY OF THE INVENTION

It is an object of the present invention to provide a data selection circuit of 1/n Duty-1/m Bias scheme in which the number of transistors required is significantly reduced.

According to an aspect of the present invention, there is a provided a data selection circuit comprising selection signal generating means for generating selection signals which specify $2^n$ combinations of ON and OFF states at preset timings; input signal generating means for sequentially generating $(m+1) \times 2^n$ input signals at preset timings and selectively setting one of the (m+1) input signals into the conductive state; and $(m+1) \times 2^n$ selection means for outputting output signals specified and selected by the input signals under the control of the selection signals at the preset timings, each of which includes decoder sections and inverter sections which are serially connected between reference power sources, the decoder sections being made conductive or non-conductive according to the selection signals and the inverter sections being made conductive or non-conductive according to the input signals, each stage being constructed by (m+1) parallel-connected selection means, output terminals of the inverter sections of the selection means of each of the $2^n$ stages being connected in a wired OR configuration with output terminals of the inverter sections of the corresponding selection means of the other stages.

According to another aspect of the present invention, there is provided a data selection circuit of 1/n Duty-1/m Bias activating scheme (m, n are integers, n≧2, m≧2)

comprising selection means of $2^n$ stages, wherein each of the selection means is constructed by decoder sections and inverter sections which are serially connected between reference power sources, the decoder sections being made conductive or non-conductive according to n-bit external selection signals which specify $2^n$ combinations of ON and OFF states, the inverter sections being made conductive or non-conductive according to $(m+1) \times 2^n$ combinations of external input signals, wherein each stage is constructed by $(m+1)$ parallel-connected selection means, output terminals of the inverter sections of the selection means of each of the $2^n$ stages being connected in a wired OR configuration with output terminals of the inverter sections of the corresponding selection means of the other stages, wherein the decoder sections of one stage of the $2^n$ stages of selection means are simultaneously and selectively set into the conductive state by the n-bit external selection signals, and an output signal specified by the external input signals is output.

According to still another aspect of the present invention, there is provided data selection circuit of 1/n Duty-1/m Bias activating scheme comprising $(m+1)$ selection means which are independently provided and each of which includes $2^n$ decoder sections for subjecting n-bit select data supplied from the exterior to different decoding processes; and $2^n$ inverter sections respectively connected in series with the decoding sections, outputs of the inverter sections being connected in a wired OR connection configuration; and characterized in that the $2^n \times (m+1)$ inverter sections are supplied with different preset input signals determined by the numeric values m, n and the logics of the corresponding decoder sections from the exterior.

Preferably, the selection means may be constructed by cascade-connecting a P-channel decoding section constructed by n P-channel transistors, an inverter section constructed by P-channel transistors and N-channel transistors, and an N-channel decoder section constructed by n N-channel transistors. When the select data is supplied, the P-channel transistors and N-channel transistors are all set into the conductive state, and the inverter section is set into the operable state. Further, it is preferable to form on a semiconductor substrate the $(m+1)$ decoder sections to which the same logic can be applied and which correspond to one another in adjacent stages in the selection means.

In the data selection circuit of 1/n Duty-1/m Bias activating scheme of the present invention, different timing signals are supplied from the exterior to the inverter sections of a clocked inverter constructed by $2^n$ combinations of the decoder sections and the inverter sections in the selection means. Only the decoder section which is connected to the inverter section supplied with the selection signal is set into the conductive state in response to supplied select data. Thus the inverter section is supplied with the power source voltage, and only the above signal is inverted and output. On the other hand, the other clocked inverters are set into the OFF state, that is, they remain in a high output impedance state. By use of the above configuration, the number of transistors required for constructing the whole circuit can be significantly reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

There will now be described an embodiment of the present invention with reference to the accompanying drawings.

In this embodiment, as an example of the 1/n Duty-1/m Bias LCD activating scheme, a data selection circuit of the present invention will be explained by using an LCD driving circuit of ⅓ Duty-⅓ Bias LCD activating scheme. The construction of the other portion of the LCD driving circuit to which the data selection circuit of the present invention is applied is the same as that of the conventional circuit.

Figure 4:
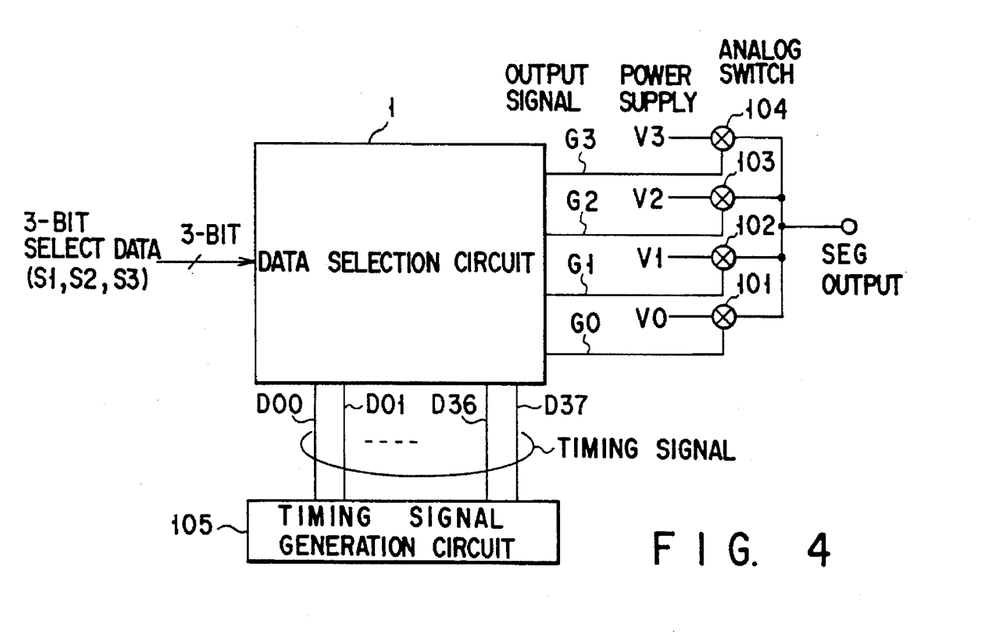
FIG. 4 is a block diagram of a data selection circuit and its peripheral circuits according to the present invention.

FIG. 4 is a block diagram showing a data selection circuit according to one embodiment of the present invention and a peripheral circuit thereof. Timing signals are selected by a combination of input n bits, for example, select data of three bits, and are output as output signals G0 to GE. As will be described later, the potential of the power sources V0 to V3 is selected by a combination of the output signals, and supplied as a SEG signal to each segment on the LCD panel.

FIG. 5 is a block diagram showing a clocked inverter circuit used as a constituent unit of the data selection circuit 1 in FIG. 4. The data selection circuit 1 of FIG. 4 is greatly different from the conventional data selection circuit 100, and $2^n \times (m+1)$ clocked inverter circuits shown in FIG. 5 are arranged side by side and connected in parallel. That is, in the data selection circuit of 1/n Duty-1 m Bias activating scheme of the present invention, $2^n \times (m+1)$ selection circuits are provided, each of which is constructed by a decoder section which is used for decoding n-bit select data and provided in a composite form in the clock section of the clocked inverter, and an inverter section serially connected with the decoder section. Unlike the conventional case, only those of the clocked inverters which are supplied with data to be selected are set into the ON state, i.e., the power source voltage is supplied, and the other clocked inverters are set into the OFF state, i.e., output impedance of the inverters being set at high state. Each of the clocked inverters is constructed by serially connecting a decoder section 8 and an inverter section 7 between the reference power sources. That is, it is constructed by a P-channel decoder section 8a connected to a (+) side power source 3, an inverter section 7, and an N-channel decoder section 8b connected to a (−) side power source 4. The decoder section 8 is constructed by the P-channel decoder section 8a constructed by a series circuit of a plurality of PMOSs and the N-channel decoder section 8b constructed by a series circuit of a plurality of NMOSs with the inverter section 7 connected therebetween. In the selection circuit SELj shown in FIG. 5, when the decoder sections 8a, 8b are set into the ON states by 3-bit select data supplied to the decoder sections 8a, 8b, a timing signal Dij input to the inverter section 7 is inverted and output as a signal $\overline{Gi}$.

Figure 6A:
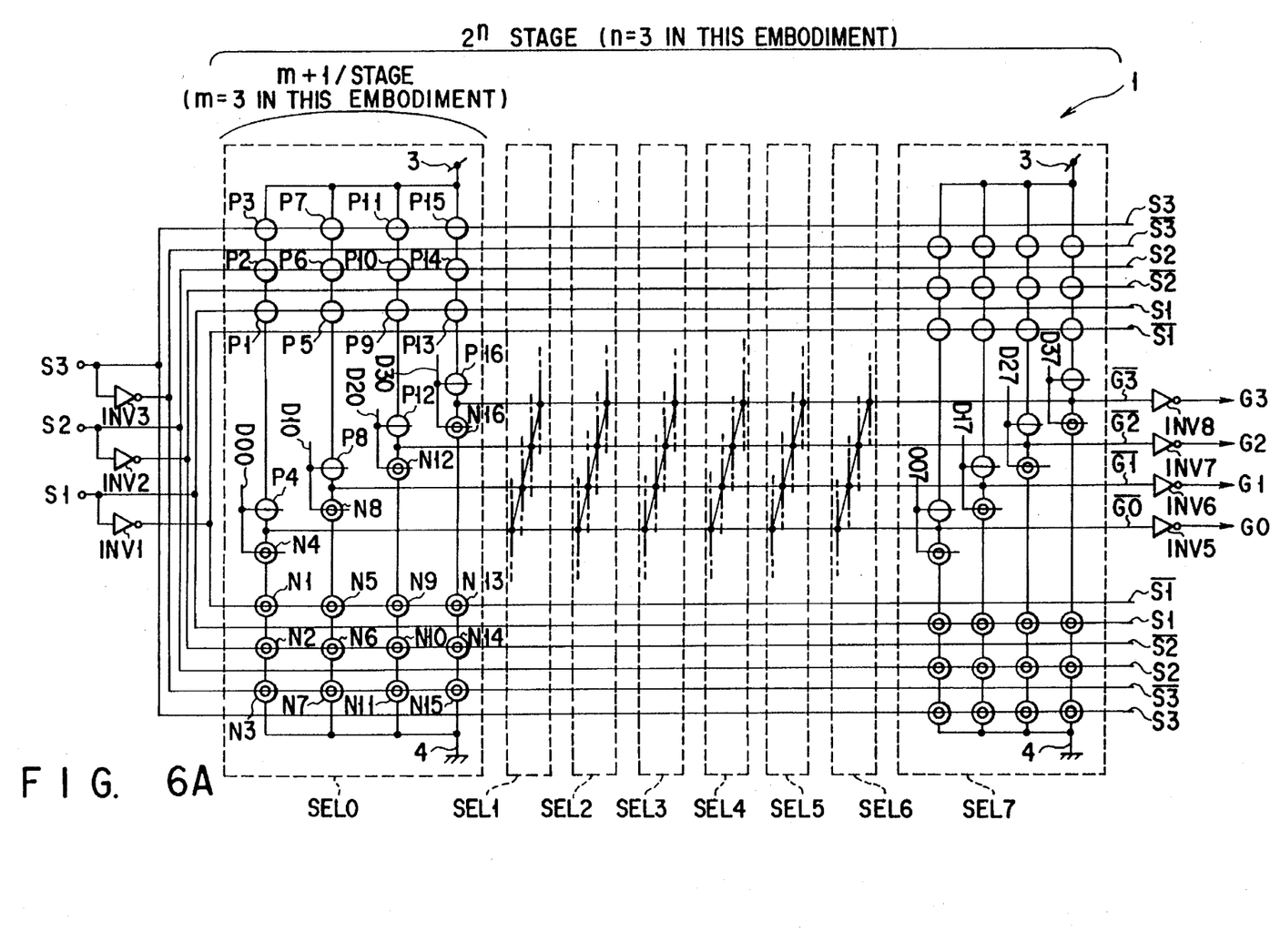
FIG. 6A is a circuit diagram showing a data selection circuit according to one embodiment of the present invention.
Figure 6B:
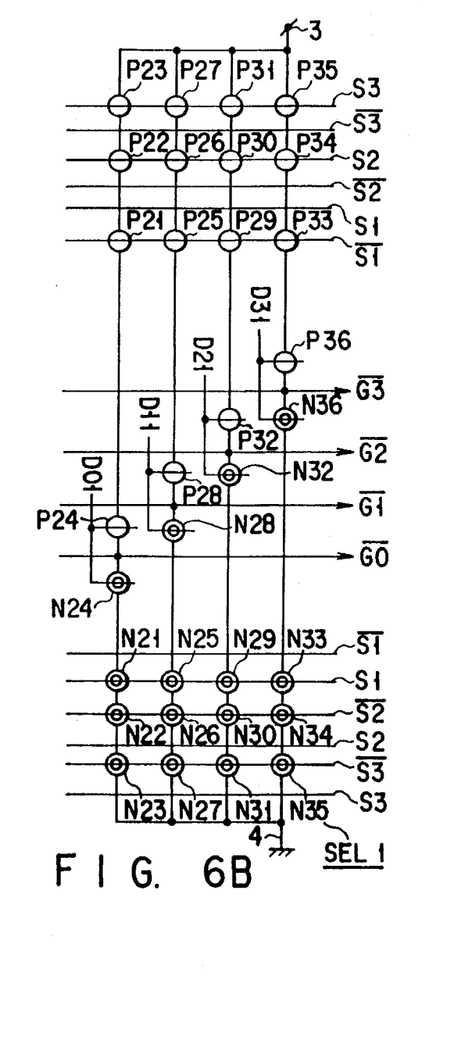
FIGS. 6B to 6G are circuit diagrams showing structures of selections circuits SEL1 to SEL6 of FIG. 6A.
Figure 6C:
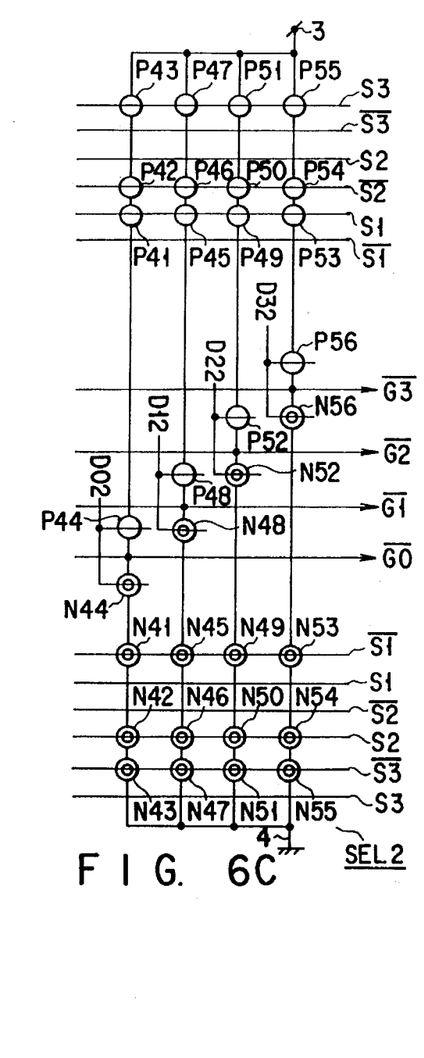
Figure 6D:
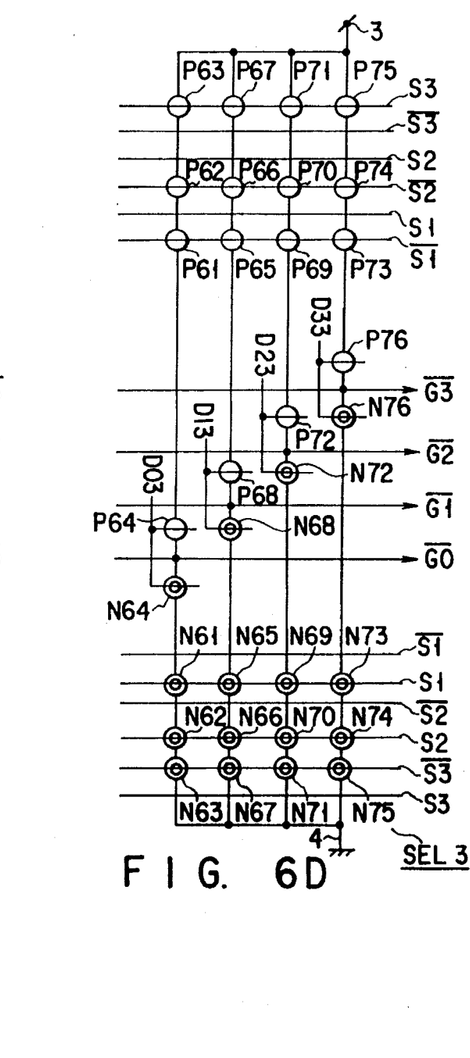
Figure 6E:
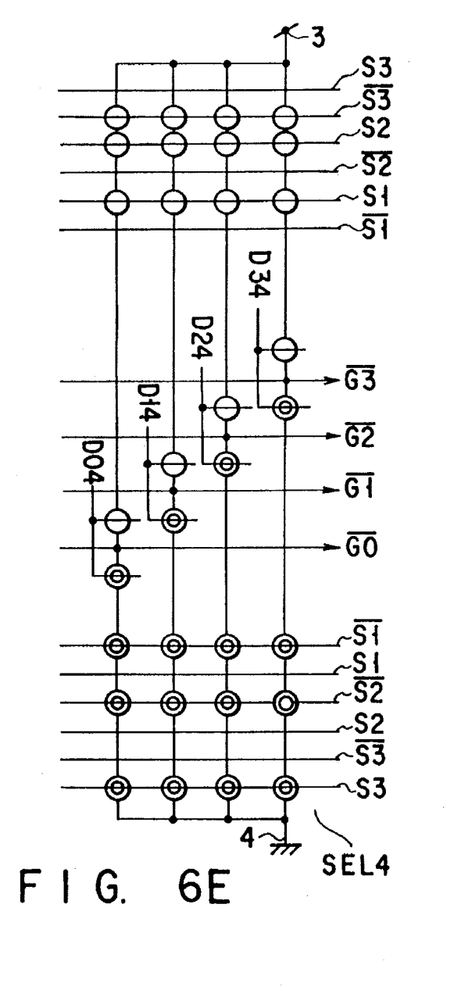
Figure 6F:
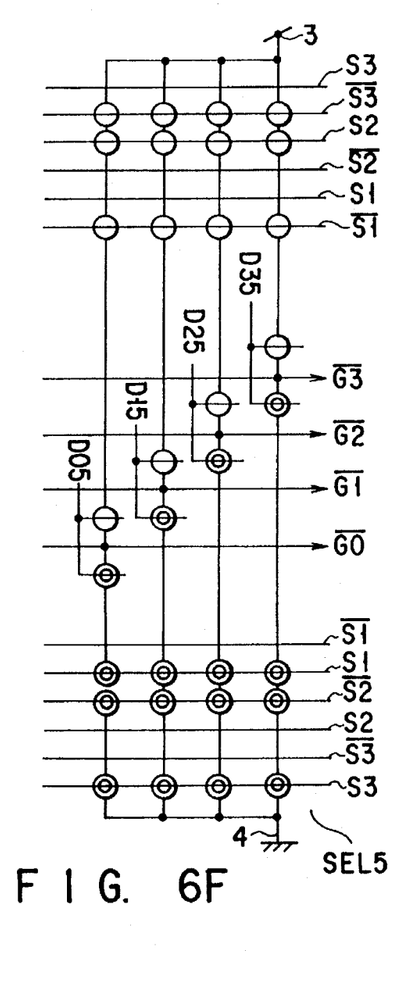
Figure 6G:
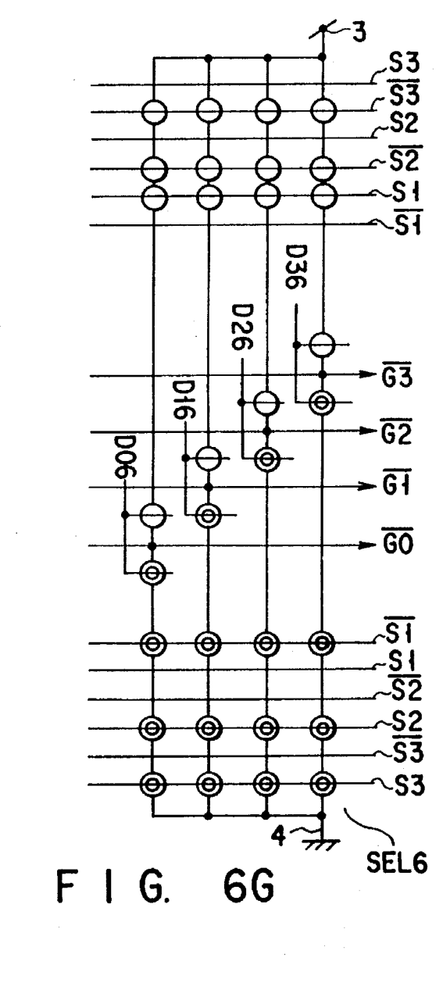
Figure 7:
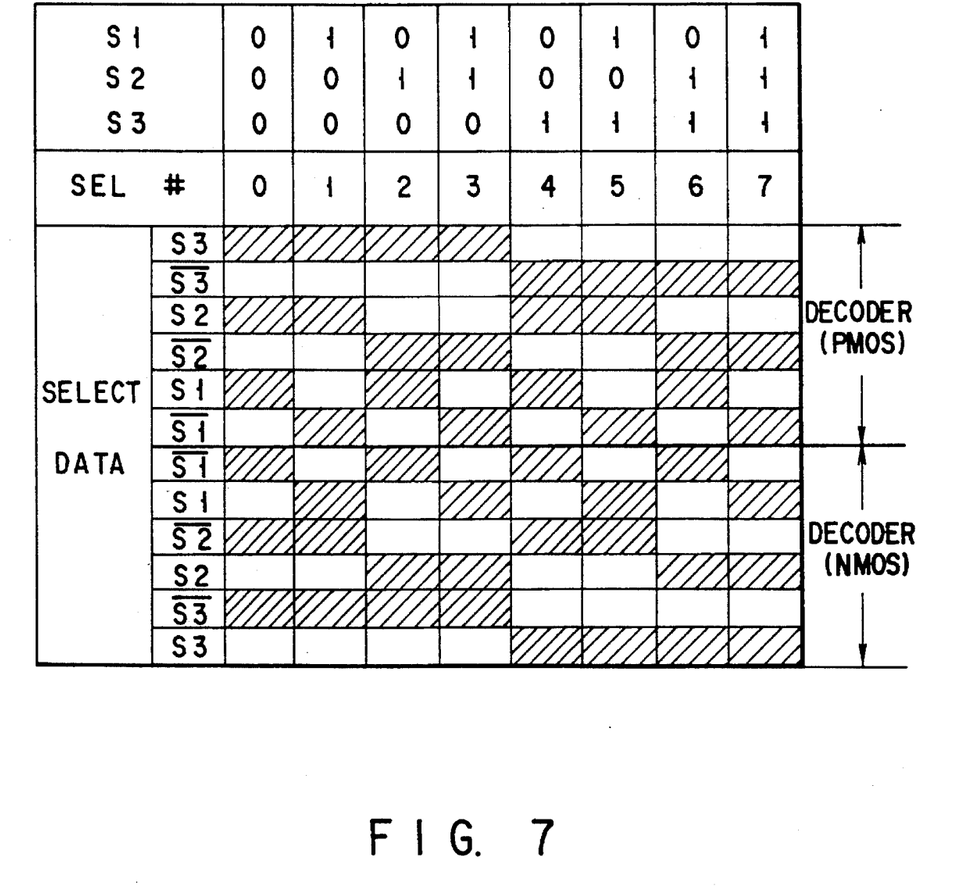
FIG. 7 is a diagram showing the connection between select data and decoder in FIGS. 6A to 6G.

FIGS. 6A to 6G are circuit diagrams showing the construction of a data selection circuit according to one embodiment of the present invention. In FIG. 6A, the constructions of the selection circuits SEL0 to SEL7 are shown, but those of the selection circuits SEL1 to SEL6 are omitted. The constructions of the selection circuits SEL1 to SEL3 are shown in FIGS. 6B to 6D and the constructions of the selection circuits SEL4 to SEL6 are shown in FIGS. 6E to 6G. In FIGS. 6A to 6G, a single-circle mark indicates a PMOS transistor and a double-circle mark indicates an NMOS transistor. Further, signal lines crossing the single-circle mark and double-circle mark indicate that the signal lines are connected to the gates of corresponding MOS transistors. Signal lines which extend in the vertical direction and connected to the single-circle mark and double-circle mark indicate that the signal lines are connected to the sources or drains of corresponding MOS transistors. The data selection circuit of this embodiment includes selection circuits SEL0 to SEL7 each of which is constructed by four clocked inverter circuits. Each of the clocked inverter circuits includes four NMOS transistors and four PMOS transistors. For example, one of the clocked inverter circuits of the selection circuit SEL0, which lies in the leftmost position in FIG. 6A, includes a decoder section, which has a first inverter constructed by an NMOS transistor N1 and a PMOS transistor P1, a second inverter constructed by an NMOS transistor N2 and a PMOS transistor P2 and a third inverter constructed by an NMOS transistor N3 and a PMOS transistor P3, and an inverter section constructed by an NMOS transistor N4 and a PMOS transistor P4. The data selection circuit 1 is supplied with 3-bit select data items S1 to S3 and inverted logic signals of the select data items S1 to S3 are generated by inverters INV1 to INV3. Select data items S1 to S3 and inverted data items $\overline{S1}$ to $\overline{S3}$ are, as shown in FIG. 6A, supplied to the gates of MOS transistors of corresponding decoder sections. Select data items S1 to S3 and $\overline{S1}$, to $\overline{S3}$ are supplied to the decoder section of each data selection circuit as shown in FIG. 7. As apparent from FIG. 7, for example, when select data of S1=S2=S3=0 is supplied, only the decoders of the four clocked inverters of the selection circuit SEL0 are set into the ON state, and the timing signals D00, D10, D20 and D30 are inverted by the respective inverters and output as signals $\overline{G0}, \overline{G1}, \overline{G2}$ and $\overline{GE}$. Further, when select data of S1=S2=S3=1 is supplied, only the decoders of the four clocked inverters of the selection circuit SEL7 are set into the ON state, and the timing signals D07, D17, D27 and D37 are inverted by the respective inverters and output as signals $\overline{G0}, \overline{G1}, \overline{G2}$ and $\overline{GE}$. The same operations are effected in the other selection circuits SEL1 to SEL6. The gates of the NMOS transistors N4, N8, N12, N16 and PMOS transistors P4, P8, P12, P16 of the inverter section of the selection circuit SEL0 are respectively supplied with timing signals D00, D10, D20, D30, which will be described later. Likewise, as shown in FIGS. 6A to 6G, the 28 inverters of the other selection circuits SEL1 to SEL7 are respectively supplied with timing signals D01 to D07, D11 to D17, D21 to D27, and D31 to D37.

Thus, the timing signals D0j, D1j, D2j and D3j output as the signals $\overline{G0}, \overline{G1}, \overline{G2}$ and $\overline{GE}$ from the selection circuit SELj according to the select data S1, S2, S3 are respectively inverted by the inverters INV5 to INV8 and are output as signals G0, G1, G2 and G3.

Figure 8:
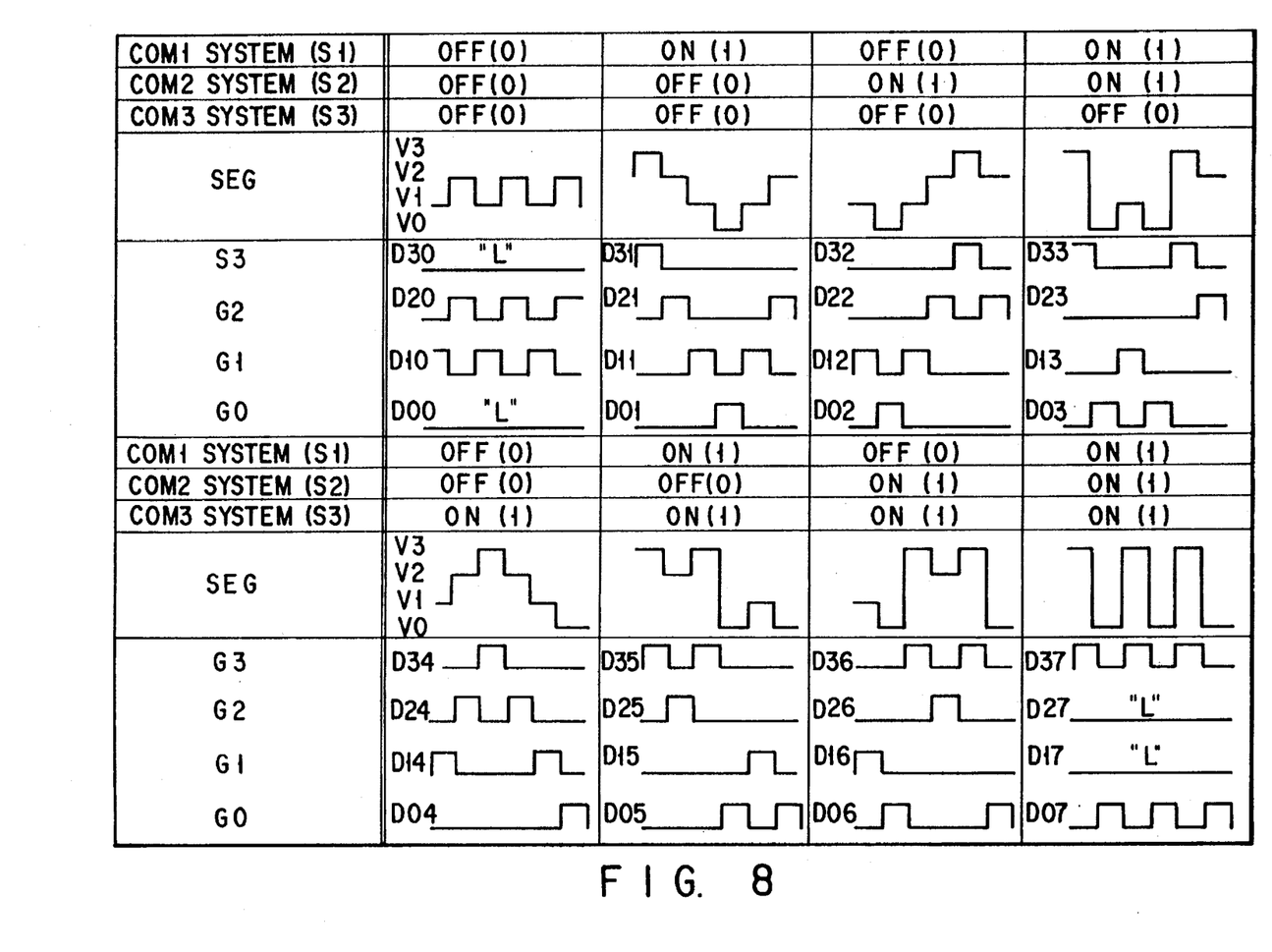
FIG. 8 is a diagram showing the waveforms of segment signals and timing signals used in the ⅓ Duty-⅓ Bias LCD activating scheme.

FIG. 8 is a diagram showing the relationship between the waveforms of timing signals and the waveform of a SEG signal in the ⅓ Duty-⅓ Bias LCD activating scheme. For example, when select data of S1=S2=S3=0 is supplied to the data selection circuit 1 of FIG. 6A, as described before, only the decoder sections of the selection circuit SEL0 are set into the ON state. In this case, at the initial timing shown in FIG. 8, the inverters P8, N8 are set into the ON state by a timing signal D10 and the timing signal D10 is supplied to an analog switch 102. As a result, the potential of the power source V1 (for example, a power source having a power source voltage of 1 V) is output as the SEG signal. At the next timing, the inverters P12, N12 are set into the ON state by a timing signal D20 and the timing signal D20 is supplied to an analog switch 103. Thus, the potential of the power source VD (for example, a power source having a power source voltage of 2 V) is output as the SEG signal. Further, at the next timing, the inverters P8, N8 are set into the ON state by a timing signal D10 again, and the timing signal D10 is supplied to the analog switch 102 and the potential of the power source V1 is output. In the same manner as described above, the potentials of the power sources V2, V1, V2 are selectively output. As a result, the SEG signal having the waveform shown in FIG. 8 is generated for the select data S1=S2=S3=0. Further, when select data of S1=1 and S2=S3=0 is supplied to the data selection circuit SEL1 of FIG. 6B, only the inverters P36, N36 are set into the ON state by a timing signal D31 at the initial timing and the timing signal D31 is supplied to an analog switch 104 and the potential of the power source V3 (for example, a power source having a power source voltage of 3 V) is output as the SEG signal. At the next timing, the inverters P32, N32 are set into the ON state by a timing signal D21 and the potential of the power source V2 is output as the SEG signal. Further, at the next timing, the potential of the power source V1 is output as the SEG signal by the timing signal D11. In the same manner as described above, the power source voltages of the power sources V0, V1, V2 are selectively output as the SEG signal. Therefore, the SEG signal having the waveform shown in FIG. 8 is generated for the select data S1=1 and S2=S3=0. The same explanation can be made for a different combination of select data. As is clearly understood from FIG. 8, the waveform of the SEG signal varies depending on the combination of select data.

Figure 9:
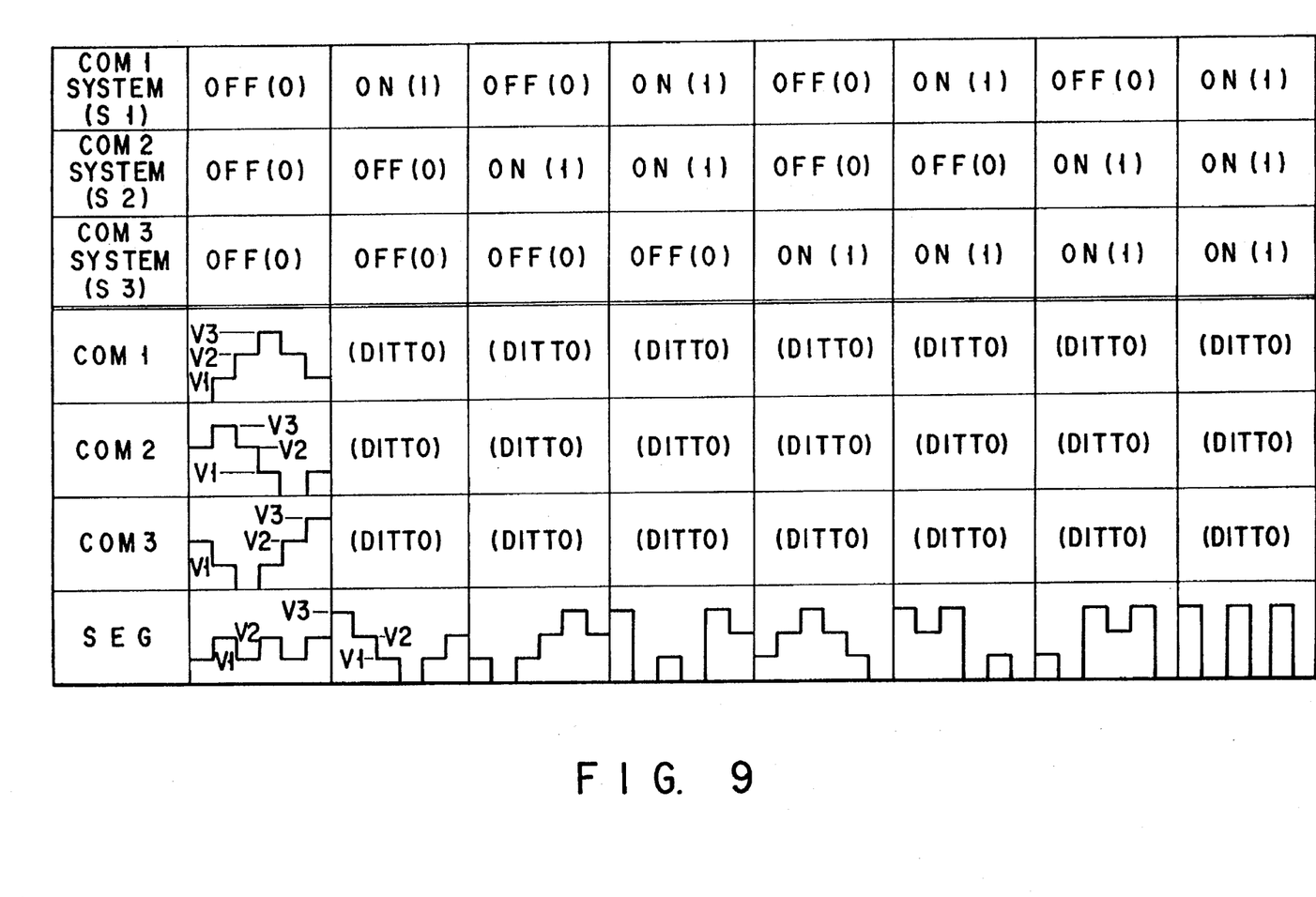
FIG. 9 is a diagram showing the waveforms of common signals and segment signals used in the ⅓ Duty-⅓ Bias LCD activating scheme.

FIG. 9 is a diagram showing the waveforms of common (COM) signals and the waveform of a SEG signal in the ⅓ Duty-⅓ Bias LCD activating scheme. The COM1, COM2, COM3 signals are generated from the COM signal generation circuit 106 as the waveforms having m Bias levels (in this embodiment, m=3, that is, V1, V2, V3 levels) with respect to a reference level (for example, potential of 0 level). The COM1, COM2, COM3 signals have fixed waveforms for respective segments and the waveform of the COM signal does not vary even if the select data is changed. The COM signals are so set that the rising waveform and the falling waveform will take the same form by taking the property of the liquid crystal into consideration.

Figure 10:
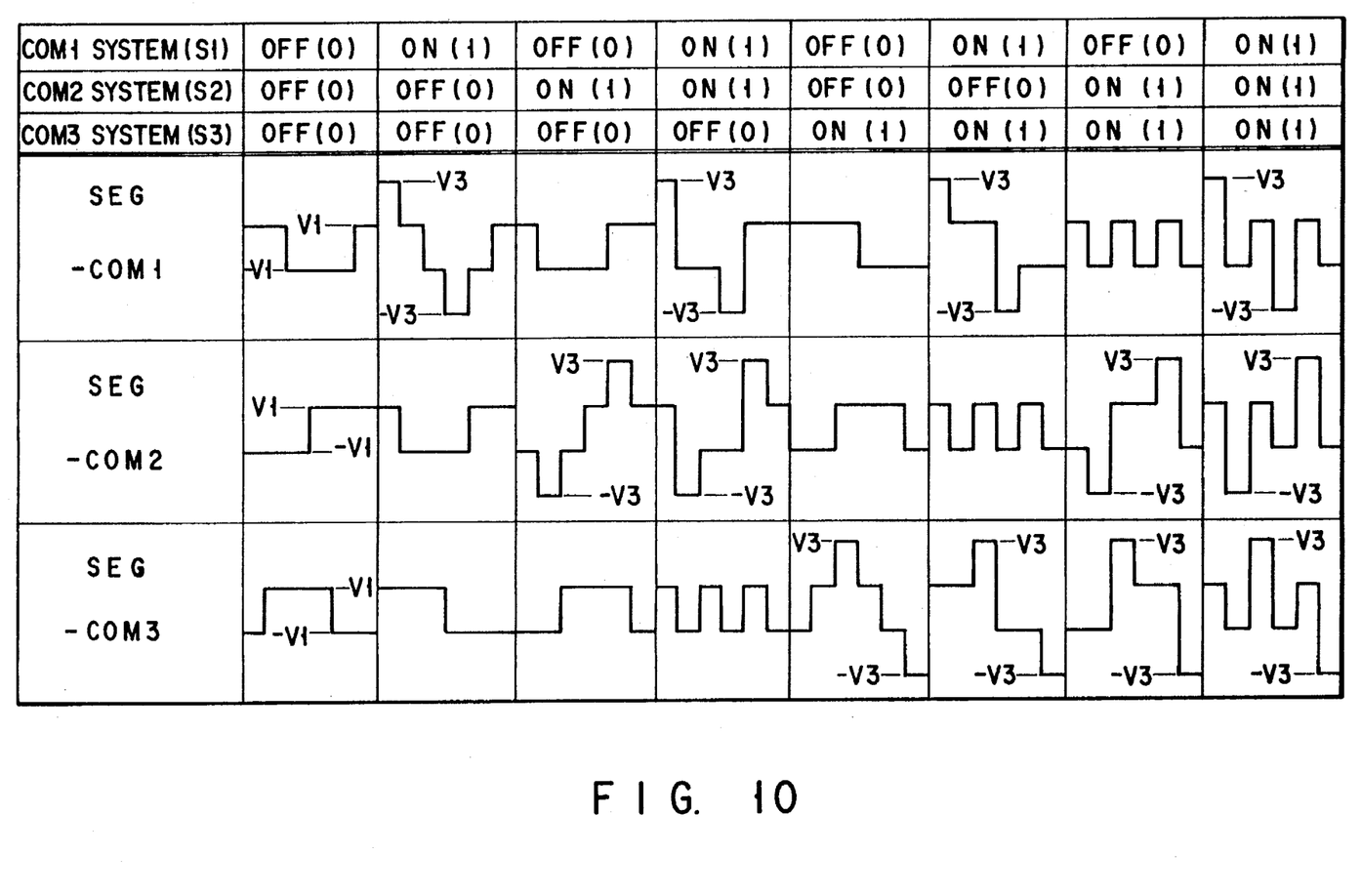
FIG. 10 is a waveform diagram showing variations in the potentials applied to the respective segments with time in the ⅓ Duty-⅓ Bias LCD activating scheme.

FIG. 10 is a waveform diagram showing a variation with time in the potential differences applied to the respective segments in the ⅓ Duty-⅓ Bias LCD activating scheme. As shown in FIG. 3, each segment is activated when the absolute value of the potential of the SEG signal is larger than that of the potential of the COM signal by a preset amount or more. Each segment is kept deactivated when a difference between the former value and the latter value is smaller than the preset amount. That is, the segment is so designed to be activated when |potential of the SEG signal−potential of the COM signal| exceeds ±V3, for example, ±3 V. In the case of select data of S1=S2=S3=0, since the absolute value of the potential of any one of the COM1, COM2, COM3 signals does not exceed ±V3, no segment is activated. In the case of select data of S1=1 and S2=S3=0, only the COM1 signal has a potential difference of V3 with respect to the SEG signal and only the segment 121 is activated and the remaining segments are kept deactivated. In the case of select data of S1=S3=0 and S2=1, only the segment 122 for the COM2 signal is activated. The same explanation can be made for other cases.

Next, with reference to FIGS. 8 to 10, the full operation of the LCD driving circuit of ⅓ Duty-⅓ Bias activating scheme using the data selection circuit of this embodiment will be explained. A case wherein the LCD driving circuit drives three segments 121 to 123 in the seven-segment display elements shown in FIG. 3 will be explained. The 3-bit select data S1 to S3 supplied to the data selection circuit 1 indicates eight combinations of ON/OFF states of the three segments 121 to 123 whose activation states are controlled. Values of the respective bits S1 to S3 of the select data vary according to the ON/OFF states of the segments 121 to 123. Each value is set to "1" when the segment is set in the ON state and is set to "0" when the segment is set in the OFF state.

For example, when the values of the respective bits of the select data are S1=S2=S3=0, the timing signals D00, D10, D20 and D30 are output as signals G0, G1, G2 and GE by the decoding operation of the selection circuit SEL0. The waveforms of the timing signals D00, D10, D20 and D30 are obtained as shown in FIG. 8. The output signals G0 to GE are supplied to analog switches 101 to 104 of FIG. 4 as control signals, and the ON/OFF states of the analog switches 101 to 104 are controlled. One ends of the current paths of the analog switches 101 to 104 are respectively connected to power sources V0 to V3 having different levels of supply voltage. In this case, the voltage V0=0 V, the voltage V2 is twice the voltage V1, and the voltage V3 is three times the voltage V1. Further, the voltage V1 is set lower than the threshold voltage of the LCD, and the voltage V3 is set to be equal to or higher than the threshold voltage of the LCD. A potential of one of the power sources V0 to V3 appears on the output terminal at a preset timing by the ON/OFF control. Thus, a SEG signal of the waveform as shown in FIG. 8 is output according to select data. The SEG signal is commonly supplied to the respective electrodes of the segments 121 to 123 of FIG. 3. On the other hand, the other electrodes of the segments 121 to 123 are respectively supplied with a COM1 signal, COM2 signal and COM3 signal of the waveforms shown in FIG. 9 by the COM signal generation circuit. Therefore, potential differences between the SEG signal and the respective COM signals, that is, SEG-COM1, SEG-COM2 and SEG-COM3 are supplied between the respective two electrodes of the segments 121 to 123 according to the select data. The waveforms thereof are shown in FIG. 10. In this case, since voltages indicated by the waveforms are lower than the threshold voltage of the LCD, all of the three segments 121 to 123 are deactivated as indicated by the select data (0, 0, 0).

Likewise, the decoder section of one of the data selection circuits is set into the conductive state by the decoding operation of the selection circuits SEL1 to SEL7 according to combinations of values of the bits S1 to S3 of the select data, which correspond to the ON/OFF states of the three segments 121 to 123 whose activation states are controlled. Thus preset timing signals having the waveforms shown in FIG. 8 are output as signals G0, G1, G2 and GE. Then, SEG signals having the waveforms shown in FIG. 8 corresponding to the respective select data items are output from the analog switches 101 to 104 whose ON/OFF states are controlled by the output signals G0 to GE. As a result, potential differences between the SEG signal and the respective COM signals corresponding to the select data items and having waveforms as shown in FIG. 10, that is, SEG-COM1, SEG-COM2 and SEG-COM3 are supplied between the respective two electrodes of the segments 121 to 123. The segments 121 to 123 are selectively activated or deactivated according to the select data.

The data selection circuit of the present invention has been explained by using the LCD driving circuit of ⅓ Duty-⅓ Bias activating scheme as an example of the 1/n Duty-1/m Bias activating scheme. However, the present invention can be applied when n and m are set to other values.

In the data selection circuit of the present invention, in a case other than the case wherein n=m=2, the number of transistors required can be significantly reduced in comparison with the conventional case. In the conventional data selection circuit, $$\{(n+1)(n^{n+3}+2^{n+2}-8)+2n\}$$

elements are required, but in the data selection circuit of the present invention, only $$\{(n+1)(16n+18)+2n\}$$

elements are required. As a result, $$\{(n+1)(n^{n+3}+2^{n+2}-16n-26)\}$$

elements can be omitted, thus providing a significant effect. Further, the effect of reduction in the number of elements in comparison with the conventional data selection circuit becomes increasingly significant with an increase in the value of n. For example, when n=m=3, in the conventional data selection circuit 100 as shown in FIG. 2, 3018 elements are required, but, in the data selection circuit of the present invention, only 270 elements are required. Therefore, in the LCD device in which ten data selection circuits which are the same as the conventional data selection circuit 100 of FIG. 2 are used, the number of elements can be reduced by 27,480 by using ten data selection circuits 1 of the present invention. Further, 2,344,480 elements are required in the conventional data selection circuit 100 of FIG. 2, but only 598 elements are required in the data selection circuit 1 of the present invention, if n=m=5. In the LCD device having ten data selection circuits 1 of the present invention, the number of elements can be reduced by 23,438,820 in comparison with the conventional LCD device having ten conventional data selection circuits 100.

In addition, the data selection circuit of the present invention has an advantage over the conventional data selection circuit that it has a structure which can be easily formed with high density when it is integrated. That is, in the present invention, since it is not necessary for the decoder section to have the driving ability for driving the next-stage elements, it becomes possible to design the decoder section with the minimum cell size. Further, as shown in FIGS. 6A to 6G, since both the P-channel decoder section and N-channel decoder section can be systematically arranged in a matrix form in the present invention, a vacant area on the substrate can be reduced in comparison with the conventional data selection circuit 100 of FIG. 2. Therefore, the occupied area of the data selection circuit can be extremely reduced.

Further, as the number of elements used in the data selection circuit can be reduced, the power consumption can be reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A data selection circuit comprising:

selection signal generating means for generating selection signals which specify $2^n$ combinations (n is an integer, $n \geq 2$) of conductive and non-conductive states at preset timings;

input signal generating means for sequentially generating $(m+1) \times 2^n$ input signals (m is an integer, $m \geq 2$) at preset timings and selectively setting one of the (m+1) input signals into the conductive state; and $(m+1) \times 2^n$ selection means for outputting output signals specified and selected by the input signals under the control of the selection signals at the preset timings, each of said selection means including decoder sections and inverter sections which are serially connected between reference power sources, said decoder sections being set into the conductive or non-conductive state according to said selection signals and said inverter sections being set into the conductive or non-conductive state according to said input signals, each of $2^n$ stages being constructed by (m+1) parallel-connected selection means, output terminals of the inverter sections of the selection means of each of said $2^n$ stages being connected in a wired OR configuration with corresponding output terminals of the inverter sections of the corresponding selection means of the other stages.

2. The data selection circuit according to claim 1, wherein said selection means is constructed by cascade-connecting a P-channel decoder section constructed by n P-channel transistors, an inverter section constructed by P- and N-channel transistors and an N-channel decoder section constructed by n N-channel transistors, wherein said P-channel and N-channel transistors are all set into the conductive state and said inverter is set into the operable state when the select data is supplied.

3. The data selection circuit according to claim 1, wherein (m+1) decoder sections which correspond to one another in said selection means and which have the same logic are arranged in adjacent positions on a semiconductor substrate.

4. The data selection circuit according to claim 1, wherein said decoder sections of said (m+1) selection means of each stage are operated by the selection signals of the same logic.

5. The data selection circuit according to claim 4, wherein said inverter section of only one of said (m+1) selection means of each stage are made conductive by the input signals, and said output signal is output from a corresponding stage of said selection means which are made conductive by the selection signals.

6. A data selection circuit of 1/n Duty-1/m Bias activating scheme (m, n are integers, $n \geq 2$, $m \geq 2$) comprising:

selection means of $2^n$ stages;

wherein each of said selection means is constructed by decoder sections and inverter sections which are serially connected between reference power sources, said decoder sections being made conductive or non-conductive according to n-bit external selection signals which specify $2^n$ combinations of ON/OFF states, said inverter sections being made conductive or non-conductive according to $(m+1) \times 2^n$ combinations of external input signals, wherein each stage of said $2^n$ stages is constructed by (m+1) selection means parallel-connected, output terminals of the inverter sections of the selection means of each of said $2^n$ stages being connected in a wired OR configuration with corresponding output terminals of the inverter sections of corresponding ones of said selection means of the other stages, wherein said decoder sections of one stage of said $2^n$ stages of selection means are simultaneously and selectively set into the conductive state by the n-bit external selection signals, and an output signal specified by the external input signals is output.

7. The data selection circuit according to claim 6, wherein said selection means is constructed by cascade-connecting a P-channel decoder section constructed by n P-channel transistors, an inverter section constructed by P- and N-channel transistors and an N-channel decoder section constructed by n N-channel transistors, wherein said P-channel and N-channel transistors are all set into the conductive state and said inverter is set into the operable state when the select data is supplied.

8. The data selection circuit according to claim 6, wherein (m+1) decoder sections which correspond to one another in said selection means and which have the same logic are arranged in adjacent positions on a semiconductor substrate.

9. The data selection circuit according to claim 6, wherein said decoder sections of said (m+1) selection means of each stage are operated by the external selection signals of the same logic.

10. The data selection circuit according to claim 9, wherein said inverter section of only one of said (m+1) selection means of each stage are made conductive by the external input signals, and the output signal is output from a corresponding stage of said selection means which are made conductive by the external selection signals.

11. In a data selection circuit of 1/n Duty-1/m Bias activating scheme (m, n are integers, $n \geq 2$, $m \geq 2$), said data selection circuit comprising:

(m+1) selection means which are independently provided and each of which includes $2^n$ decoding sections for subjecting n-bit select data supplied from the exterior to different decoding processes, and $2^n$ inverter sections respectively connected in series with said decoding sections, outputs of said inverter sections being connected in a wired OR connection configuration;

wherein said $2^n \times (m+1)$ inverter sections are supplied with different preset input signals determined by the numeric values m, n and the logic of the corresponding decoding sections from the exterior.

12. The data selection circuit according to claim 11, wherein said selection means is constructed by cascade-connecting a P-channel decoder section constructed by n P-channel transistors, an inverter section constructed by P- and N-channel transistors and an N-channel decoder section constructed by n N-channel transistors, wherein said P-channel and N-channel transistors are all set into the conductive state and said inverter is set into the operable state when the select data is supplied.

13. The data selection circuit according to claim 11, wherein (m+1) decoder sections which correspond to one another in said selection means and which have the same logic are arranged in adjacent positions on a semiconductor substrate.

\* \* \* \* \*